United States Patent [19]
Dingwall et al.

[11] 4,039,862
[45] Aug. 2, 1977

[54] LEVEL SHIFT CIRCUIT

[75] Inventors: Andrew Gordon Francis Dingwall, Somerville, N.J.; Bruce David Rosenthal, Mountain View, Calif.

[73] Assignee: RCA Corporation, New York, N.Y.

[21] Appl. No.: 649,972

[22] Filed: Jan. 19, 1976

[51] Int. Cl.² .................. H03K 17/60; H03K 17/04; H03K 3/286; H03K 3/353
[52] U.S. Cl. .................. 307/247 R; 307/251; 307/264; 307/279; 307/DIG. 1
[58] Field of Search ............... 307/205, 208, 214, 246, 307/247 R, 251, 279, 288, DIG. 1, 264

[56] References Cited

U.S. PATENT DOCUMENTS

| | | | |
|---|---|---|---|
| 3,509,379 | 4/1970 | Rapp | 307/288 X |
| 3,801,831 | 4/1974 | Dame | 307/251 |
| 3,916,430 | 10/1975 | Heuner et al. | 307/DIG. 1 X |
| 3,942,043 | 3/1976 | Sirocka et al. | 307/279 |
| B 459,425 | 1/1975 | Oguey et al. | 307/279 X |

Primary Examiner—John S. Heyman
Assistant Examiner—Larry N. Anagnos
Attorney, Agent, or Firm—H. Christoffersen; Henry I. Schanzer

[57] ABSTRACT

Each one of two switching transistors, driven by complementary input signals, has its conduction path connected between a different one of two output terminals and a first point of potential. Connected between each output terminal and a second point of potential are the conduction paths of a load transistor responsive to the signal at the other output terminal, and an input signal responsive transistor. When the switching transistor connected to one output terminal is being turned on, the effective impedance of the input signal responsive transistor connected between that output and the second point of potential is increased, thereby increasing the speed of response of the circuit and minimizing its power dissipation.

1 Claim, 4 Drawing Figures

LEVEL SHIFT CIRCUIT

This invention relates to switching circuits which are particularly useful in level shift applications.

It is often necessary and/or desirable to operate different parts of an electronic system at different voltage levels. At the places where the different parts interface, they must be coupled to each other. However, the signals at the interfaces are not necessarily compatible. It is therefore, often necessary to provide interface and level shift circuits which render one part of the system compatible with the other.

For an interface or level shift circuit to be useful it must be compatible with the other circuits of the system with respect, among others, to speed of operation, and minimzation of powder dissipation.

The invention is best understood and explained with reference to the accompanying drawing in which like reference characters denote like components, in which transistorsof P-conductivity type are identified by the letter P followed by a reference numeral, and transistors of N-conductivity type are identified by the letter N followed by a reference numeral; and in which FIG. 1 is a schematic diagram of a prior art circuit;

Figure 1:
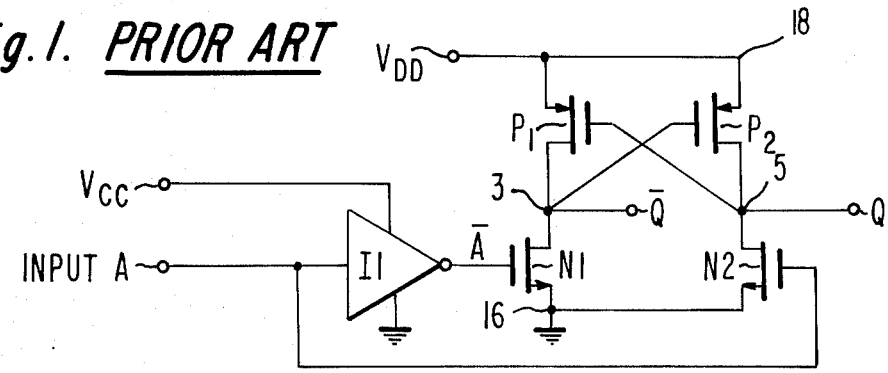

The prior art level shift circuit shown in FIG. 1 includes an input inverter $I_1$ operated between a first potential of $V_{CC}$ volts and ground. In response to an input signal A applied to its input, inverter $I_1$ produces a signal $\bar{A}$. The complementary signal A and $\bar{A}$ are applied to the gates of transistors N1 and N2 which are the inputs of the two level shift inverters comprised of transistors N1, P1 and N2, P2. The sources of transistors N1 and N2 are connected to ground conductor 16. Cross-coupled transistors P1 and P2, which function as the load devices of the level shift inverters, have their conduction paths connected between a conductor 18 to which is applied a potential of $V_{DD}$ volts and the drains of transistors N1 and N2, respectively. The drains of transistors P1 and N1 and connected to output node 3 at which is produced output $\bar{Q}$, and the drains of transistors P2 and N2 are connected to output node 5 at which is produced output Q. The gate of transistor P1 is connected to the Q output and the gate of transistor P2 is connected to the $\bar{Q}$ output.

The potential $V_{DD}$ may be, typically in the range of 5 to 15 volts and $V_{CC}$ may be, typically, in the range of 1.5 to 5 volts. In response to input signals A and $\bar{A}$ which vary between $V_{CC}$ volts and ground, output signals are produced at Q and $\bar{Q}$ which vary between $V_{DD}$ and ground.

Assume that A, which was initially at $V_{CC}$ volts, goes low (i.e. from $V_{CC}$ volts to ground). This causes transistor N1 to be turned on, and transistor N2 to be turned off. However, the $\bar{Q}$ and Q outputs which were at $V_{DD}$ and ground, respectively, do not go immediately to ground and $V_{DD}$, respectively. When transistor N1 turns on, transistor P1 is still turned on and conducting. To guarantee switching of the level shift inverters, the on impedance of each P-type transistor is made much greater than the on impedance of the associated N-type transistor for the same bias conditions. This ensures that when transistor N1 (N2) turns on, $\bar{Q}$ (Q) drops significantly below $V_{DD}/2$. However, the high on-impedances of the P-type transistors slow the rise time of Q and $\bar{Q}$.

$\bar{Q}$ going low and applied to the gate of transistor P2 turns it on. Current then flows through the conduction path of transistor P2, charging the capacitance associated with output node 5 and causing the Q output to rise towards $V_{DD}$. When transistor N2 is being turned off, transistor P2 serves as the means to charge up the capacitance associated with output node 5. Until this capacitance is charged up to approximately $V_{DD}$, transistor P1 is on. Since transistor P2 is a high impedance device it takes a relatively long time to charge up the capacitance at node 5. Consequently, transistor P1 is on for a relatively long period of time. Also, when transistor P2 is first turned on by $\bar{Q}$ going low, transistor P2 is not turned on as hard as it can be since the potential at Q does not drop immediately to ground. During the transition period, the current flowing through transistor P1 is conducted through on-transistor N1 to ground. Therefore, the longer the transistor period from one state to the next, the greater is the power dissipated.

The prior art circuit has many desirable features, but it is relatively slow and dissipates a reltively large amount of power during its relatively slow transition from one state to another.

In circuits embodying the invention, a means responsive to the input signal or its complement is connected in series with each switching transistor (N1 or N2) and its load device (P1 or P2) in order to increase the effective load impedance in series with the conduction path of the switching transistor being turned on. This increases the speed of response of the circuit and decreases its power dissipation.

Figure 2:
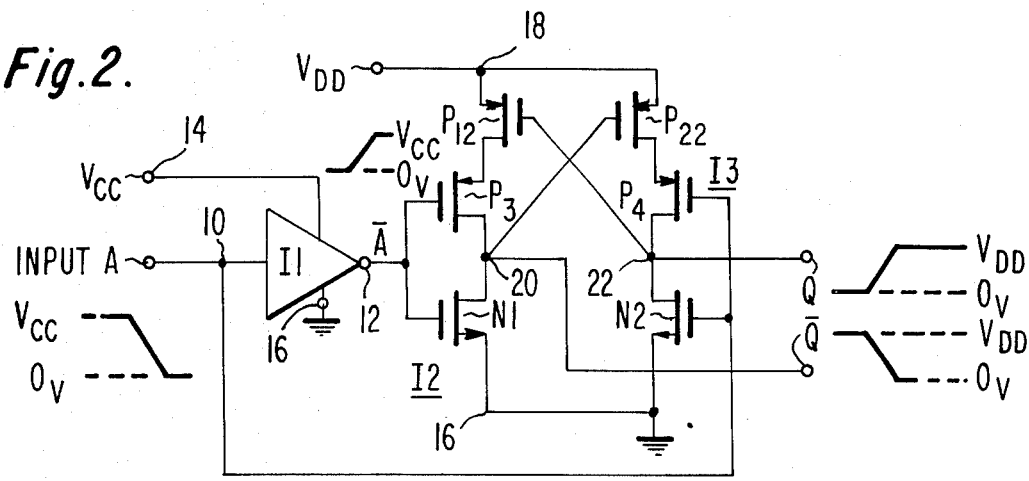
FIG. 2 is a schematic diagram of a level shift circuit embodying the invention.
Figure 4:
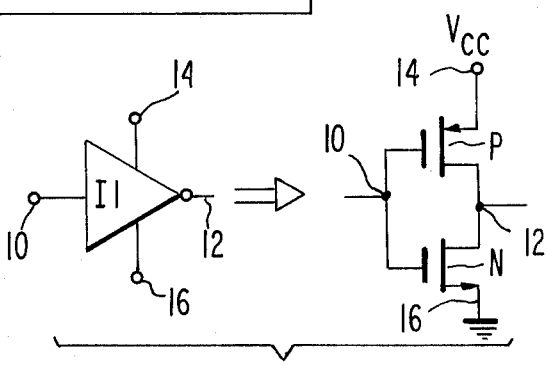
FIG. 4 is a block and schematic diagram of a prior art inverter circuit.

FIG. 2 includes an input inverter $I_1$ having an input terminal 10 to which is applied an input signal A, an output terminal 12 at which inverter $I_1$ produces a complementary signal $\bar{A}$, and power terminals 14 and 16 to which are applied $V_{CC}$ volts and ground, respectively. Inverter $I_1$ may be a complementary inverter comprised of an N-type transistor and a P-type transistor as shown in FIG. 4, or it may be any one of a number of well known devices capable of inverting signals.

Two cross-coupled inverting means, $I_2$ and $I_3$, driven by signals A and $\bar{A}$ produce level shifted output signals Q and $\bar{Q}$ which vary between ground and $V_{DD}$ volts. Inverting means $I_2$ includes switching transistor N1 and load transistor P3 and P12. Inverting means $I_3$ includes switching transistor N2 and load transistors P4 and P22. The gates of transistors N1 and P3 are connected to terminal 12. The gates of transistors P4 and N2 are connected to terminal 10. The drains of transistors N1 and P3 are connected to output point 20 at which is produced output signal $\bar{Q}$. The drains of transistors P4 and N2 are connected to output point 22 at which is produced output signal Q. The sources of transistors N1 and N2 are connected to conductor 16 which is grounded. The source-drain path of transistor P12 is connected between a conductor 18 to which is applied $V_{DD}$ volts and the source of transistor P3. The source drain path of transistor P22 is connected between conductor 18 and the source of transistor P4. Transistors P12 and P22 are cross-coupled; i.e. the gate of transistor P12 is connected to output point 22, and the gate of transistor 22 is connected to output point 20.

In the discussion of the operation of the circuit to follow, it is assumed that $V_{CC}$ is less than $V_{DD}$; and that signals A and $\overline{A}$ are switched between ground and $V_{CC}$.

The status of the circuit in a steady state condition will first be discussed. Assume, initially, that A is high ($V_{CC}$ volts) and, consequently, that $\overline{A}$ is low (ground). $\overline{A}$ low causes transistor N1 to be turned off and transistor P3 to be turned full on. When A is high, transistor N2 is turned on and the Q output at node 22 is at, or close to, ground potential (Q is low). Q low is applied to the gate of transistor P12 and keeps it fully turned on. Transistor P3 then couples the $V_{DD}$ volts at conductor 18 to source of transistor P12. Transistors P12 and P3 with their gates at zero volts, are fully turned on. Their conduction paths present a relatively low impedance between conductor 18 and terminal 20. Since transistor N1 is off, there is no conduction through its source-drain path. Therefore, transistor P12 and P3 clamp output point 20 to $V_{DD}$ volts and $\overline{Q}$ is high. $\overline{Q}$ high, applied to the gate of transistor P22 turns it off. With transistor P22 turned off, transistor P4 cannot conduct since its source is effectively disconnected from terminal 18.

For the complementary input condition (A low and $\overline{A}$ high), transistor N1 is switched on clamping output point 20 to ground ($\overline{Q}$ — low) and transistors P22 and P4 are also turned on clamping output point 22 to $V_{DD}$ volts (Q high). Transistors N2, P12, and P3 are turned off.

The response of the circuit to the transient condition, when the input signal changes levels, will now be discussed. Assume that the input signal A makes a transition from the high level ($V_{CC}$) condition to the low level (ground) condition. Consequently, $\overline{A}$ makes a transition from the low level (ground) condition to the high level ($V_{CC}$) condition.

As the $\overline{A}$ signal rises from ground towards $V_{CC}$ volts, it reaches a value equal to the threshold voltage ($V_T$) of transistor N1. Transistor N1 then turns on and the potential at $\overline{Q}$ starts to go from $V_{DD}$ volts towards zero volts. Concurrently, the turn on drive applied between the gate and source of transistor P3 is being decreased. Transistor P3 is not turned off by the application of the $\overline{A}$ signal whose maximum is $V_{CC}$ volts (where $V_{CC}$ is less than $V_{DD}$ by at least one threshold voltage). But, the conductivity of its conduction path is being decreased and, correspondingly, the impedance of its conduction path is being increased. Transistor N1 functions as a low impedance path sinking the current flowing into node 20 ($\overline{Q}$) to ground conductor 16. Increasing the impedance of the load (transistor P3 and/or transistor P12) in the drain circuit of conducting transistor N1 causes the potential of $\overline{Q}$ at output 20 to drop more and faster. Thus, increasing the impedance of transistor P3 is equivalent to increasing the gain of inverting means $I_2$ a greater output voltage change is obtained for the same current level.

Since the impedance of the conduction path of transistor P3 (or P4) increases as soon as transistor N1 (or N2) is being turned on, load transistor P12 (or P22) can be made to have a lower on impedance (higher conductivity) than the corresponding load transistor P1 (or P2) in the prior art circuit.

Concurrent with the turn on of transistor N1 and the decrease in forward drive to transistor P3, the impedance of transistor P12 is also increased by means of positive feedback obtained from the inverting means $I_3$.

The transition of the A signal from the high level to the low level is directly applied to the gate of transistor N2 cutting it off. The A signal is simultaneously applied to the gate of transistor P4 applying to its gate the maximum forward drive available. This enables transistor P4 to pass all the current supplied to its source by transistor P22 which is being turned on by the negative going signal $\overline{Q}$ at the drain of transistor N1. The turn on of transistor P22 enables the conduction of current into output node 22 causing the output level at Q to rise towards $V_{DD}$ volts. As the potential at Q rises towards $V_{DD}$ volts an increasing turn off signal is applied to the gate of transistor P12, decreasing the conductivity of its conduction path. This is equivalent to increasing the impedance of its conduction path.

Increasing the impedance of the conduction path of transistor P12 causes the potential at its drain and at the source of transistor P3 to decrease. The conductivity of transistor P3 is decreased sharply since its gate potential is being increased and, concurrently, its source potential is being decreased. Thus, there is a sharp increase in the effective impedance of the source drain path of transistor P3.

The increase in the effective impedance of transistor P12 in series with the increasing impedance of transistor P3 causes a sharp drop in the $\overline{Q}$ potential level. This applies still greater forward drive to the gate of transistor P22, which causes increased conduction into output node 20 causing a fast rise in the Q output and a still further increase in the effective impedance of transistor P12.

The process described above continues until the output Q is driven to, or close to, $V_{DD}$ volts and $\overline{Q}$ is driven to, or close to, ground potential.

For the complementary transition condition to the one just discussed, the same operation described above occurs with the roles of inverting means $I_2$ and $I_3$ being interchanged. Therefore, this condition need not be detailed.

In circuits embodying the invention, the potential at an output node (20 or 22) makes a transition from the high level to the low level in less time than in the prior art circuit of FIG. 1. The faster drop of the falling output ($\overline{Q}$ or Q) causes a faster turn on of one of the load transistors (P12 or P22) and the faster application of a turn off potential to the other one of the load transistors. Therefore, the period of time when transistors P12, P3 and N1 are simultaneously turned on is greatly decreased. Secondly, during the transition period when transistors P12, P3, and N1 are simultaneously turned on, the impedance between conductor 18 and node 16 is considerably higher than in the prior art circuit, thereby reducing the power dissipation of the circuit.

It would seem, at first glance, that transistors P3 and P4 would not have an effect on circuit operation and would not be necessary. Where $V_{CC}$ is less than $V_{DD}$ by more than one threshold voltage, transistor P3 or P4 cannot be turned off by the $\overline{A}$ or A input signals applied to their gates since the maximum value of the A and $\overline{A}$ is $V_{CC}$ volts while the potential applied to the sources of transistors P3 or P4, when turned on, is at or close to $V_{DD}$ volts. However, for the reasons discussed above and on the basis of testing it is seen that with the addition of transistors P3 and P4, functioning as load means which are responsive to the input signal, significant improvements in circuit operation are achieved.

The prior art circuit of FIG. 1 and the circuit of FIG. 2 were fabricated and their operation compared. In both circuits, transistors N1 and N2 were made the same size, and transistors P3, P4, P12 and P22 were made the same size as transistors P1 and P2. A variable frequency signal generator (not shown) was applied to the input terminal 10 of both circuits and the frequency of the applied signal was increased from a low value until a cut off frequency point at which the circuit being tested could no longer follow the transitions of the input signals produced by the signal generator. The cut off frequency point for the circuit of FIG. 2 was four times greater than that of the circuit of FIG. 1.

Measurements are indicated that the circuit of FIG. 2 functioned with a minimum $V_{CC}$ level which was 15 percent less than the minimum $V_{CC}$ level needed to properly operate the circuit of FIG. 1.

Figure 3:
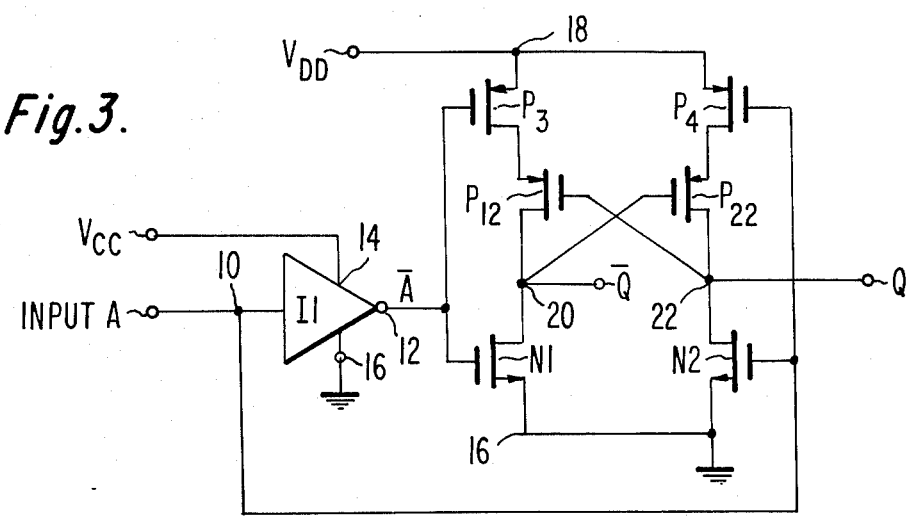
FIG. 3 is a schematic diagram of another level shift circuit embodying the invention.

The circuit of FIG. 3 is like that of FIG. 2 except that the conduction paths of transistors P3 and P12 and those of transistors P4 and P22 have been interchanged positionally. In this configuration the conduction of transistors P3 or P4 controls the current and voltage supplied to the sources of transistors P12 or P22. The conduction of transistors P3 or P4 is decreased when a turn on signal is applied to its associated switching transistors N1 or N2 and, in turn, the conduction of its associated transistor P12 or P22 is also decreased. Cross-coupled transistors P12 and P22 function in a similar manner to that described above and the transient response of the circuit need not be detailed.

Although the circuit was primarily designed for use as a level shifter with $V_{CC}$ less than $V_{DD}$, the circuit will operate with $V_{CC}$ equal to $V_{DD}$ and even when $V_{CC}$ is slightly greater than $V_{DD}$.

It should also be appreciated that the two load transistors (P12 and P3 or P22 and P4) connected between each output and $V_{DD}$ could be replaced by a single transistor having two control electrodes. In the alternative, additional transistors could be inserted in series with the two load transistors without departing from the invention.

What is claimed is:

1. A level shift circuit comprising:
   first and second power terminals for the application thereto of first and second voltages, respectively;
   first and second transistors of one conductivity type and third, fourth, fifth and sixth transistors of second conductivity type; each transistor having a conduction path and a control electrode;
   first and second output terminals;
   means connecting the conduction paths of said first and second transistors between said first power terminal and said first and second output terminals; respectively
   means connecting the conduction paths of said third and fourth transistors in series between said second power terminal and said first output terminal;
   means connecting the conduction paths of said fifth and sixth transistors in series between said second power terminal and said second output terminal;
   an input terminal for the application thereto of input signals which vary in amplitude between a first value equal to that of said first voltage and a second value intermediate said first and second voltages;
   a third terminal for the application thereto of an operating voltage intermediate said first and second voltages;
   an inverter having an input and an output and two power terminals; said inverter being connected at its input to said input terminal, at one of its power terminals to said third power terminal, and at its other power terminal to said first power terminal whereby the signal at said inverter output varies in amplitude between the voltages at said first and third power terminals;
   means connecting the control electrodes of said first and third transistors to said input terminal for increasing the impedance of the conduction path of said third transistor when said first transistor is being turned on;
   means connecting the control electrodes of said second and fifth transistors to said inverter output for increasing the impedance of the conduction path of said fifth transistor when said second transistor is being turned on;
   means connecting the control electrode of said fourth transistor to said second output terminal; and
   means connecting the control electrode of said sixth transistor to said first output terminal.

* * * * *

UNITED STATES PATENT OFFICE
CERTIFICATE OF CORRECTION

PATENT NO. : 4,039,862
DATED : August 2, 1977
INVENTOR(S) : Andrew Gordon Francis Dingwall et al It is certified that error appears in the above-identified patent and that said Letters Patent are hereby corrected as shown below:

Column 1, line 14 "circuits which render" should read --- circuits which can render ---.

Column 1, line 19 "powder" should read --- power ---.

Column 1, line 23 "transistorsof" should read --- transistors of ---.

Column 1, line 37 "signal" should read --- signals ---.

Column 2, line 23 change "transistor" to --- transition ---.

Column 3, line 12 change "P3" to --- P12 ---.

Column 3, line 12 change "18 to source" to --- 18 to the source ---.

Column 3, line 13 change "P12" to --- P3 ---.

Column 3, line 54 after "$I_2$" insert --- since ---.

Column 5, line 10 "are" should be --- also ---.

*Signed and Sealed this*

*Twenty-ninth* Day of *November 1977*

[SEAL]

Attest:

RUTH C. MASON
*Attesting Officer*

LUTRELLE F. PARKER
*Acting Commissioner of Patents and Trademarks*